United States Patent
Ziazadeh et al.

(10) Patent No.: US 7,630,422 B1
(45) Date of Patent: Dec. 8, 2009

(54) DRIVER FOR VERTICAL-CAVITY SURFACE-EMITTING LASER AND METHOD

(75) Inventors: Ramsin M. Ziazadeh, San Jose, CA (US); Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 239 days.

(21) Appl. No.: 11/036,767

(22) Filed: Jan. 14, 2005

(51) Int. Cl.
*H01S 3/00* (2006.01)

(52) U.S. Cl. ............. 372/38.02; 372/38.1; 372/29.015; 372/38.07

(58) Field of Classification Search ............ 372/29.012, 372/29.015, 38.1, 38.01–38.09, 38
See application file for complete search history.

(56) References Cited

U.S. PATENT DOCUMENTS

| | | | |
|---|---|---|---|
| 5,414,280 A | 5/1995 | Girmay | |
| 5,495,463 A | 2/1996 | Akagi et al. | |
| 5,850,409 A | 12/1998 | Link | |
| 5,859,658 A | 1/1999 | Hammond | |
| 6,064,238 A | 5/2000 | Wight et al. | |
| 6,078,601 A | 6/2000 | Smith | |
| 6,097,159 A * | 8/2000 | Mogi et al. ................ 315/151 |
| 6,272,160 B1 * | 8/2001 | Stronczer ................ 372/38.02 |
| 6,327,064 B1 | 12/2001 | Zhu | |
| 6,355,905 B1 | 3/2002 | Sasaki et al. | |
| 6,356,774 B1 | 3/2002 | Bernstein et al. | |
| 6,359,330 B1 | 3/2002 | Goudard | |
| 6,441,558 B1 | 8/2002 | Muthu et al. | |
| 6,480,067 B1 | 11/2002 | Kobayashi et al. | |
| 6,760,124 B1 | 7/2004 | Boerger et al. | |
| 6,807,202 B1 | 10/2004 | Plamper et al. | |
| 6,822,987 B2 | 11/2004 | Diaz et al. | |
| 6,853,657 B2 | 2/2005 | Althaus et al. | |
| 6,890,097 B2 | 5/2005 | Tanaka | |
| 6,973,107 B2 | 12/2005 | Diaz et al. | |
| 7,019,883 B2 | 3/2006 | Moon et al. | |
| 7,023,543 B2 | 4/2006 | Cunningham | |
| 7,065,303 B1 | 6/2006 | Kerem | |
| 7,106,969 B1 | 9/2006 | Lichtman et al. | |
| 2002/0003821 A1 | 1/2002 | Dietrich et al. | |
| 2002/0064193 A1 | 5/2002 | Diaz et al. | |
| 2002/0181520 A1 | 12/2002 | Iguchi et al. | |
| 2003/0035259 A1 | 2/2003 | Mauder et al. | |
| 2003/0057888 A1 | 3/2003 | Archenhold et al. | |
| 2003/0086455 A1 * | 5/2003 | Ciubotaru et al. ........ 372/38.02 |
| 2003/0108071 A1 | 6/2003 | Hedin et al. | |
| 2003/0165168 A1 * | 9/2003 | Murata ................ 372/38.02 |
| 2003/0175037 A1 | 9/2003 | Kimmitt et al. | |

(Continued)

*Primary Examiner*—Minsun Harvey
*Assistant Examiner*—Tod T Van Roy

(57) ABSTRACT

A driver for a vertical-cavity surface emitting laser (VCSEL) is provided that includes a bias current source, a modulation current source, and an output tracking circuit. The bias current source is operable to generate a bias current and an output voltage for the VCSEL and to generate a replica output voltage. The modulation current source is coupled to the bias current source by at least one switch and is operable to generate a modulation current for the VCSEL when the switch is closed. The output tracking circuit is coupled to the bias current source. The output tracking circuit is operable to generate a feedback signal for the bias current source based on the output voltage and the replica output voltage. The bias current source is also operable to generate the output voltage and the replica output voltage based on the feedback signal.

20 Claims, 2 Drawing Sheets

U.S. PATENT DOCUMENTS

| | | |
|---|---|---|
| 2003/0219050 A1 | 11/2003 | Couch |
| 2004/0022285 A1 | 2/2004 | Romm |
| 2005/0030985 A1 | 2/2005 | Diaz et al. |
| 2005/0041707 A1* | 2/2005 | Mangano et al. ......... 372/38.02 |
| 2005/0111797 A1 | 5/2005 | Sherrer et al. |
| 2005/0249252 A1 | 11/2005 | Sanchez |
| 2005/0271101 A1 | 12/2005 | Diaz et al. |

* cited by examiner

DRIVER FOR VERTICAL-CAVITY SURFACE-EMITTING LASER AND METHOD

RELATED APPLICATION

This application is related to co-pending U.S. application Ser. No. 11/035,686 entitled "SYSTEM FOR CONTROLLING PEAKING FOR A DRIVER FOR A VERTICAL-CAVITY SURFACE-EMITTING LASER", filed on Jan. 14, 2005.

TECHNICAL FIELD OF THE INVENTION

The present invention relates generally to optical data communication and, more particularly, to an improved driver for a vertical-cavity surface-emitting laser and method.

BACKGROUND OF THE INVENTION

Vertical-cavity surface-emitting lasers (VCSELs) are widely used in today's high-speed optical data communications channels. One problem, however, with the use of VCSELs is their electrical and optical power characteristics, which can vary a great deal across process and temperature variations. This imposes limits on the driver to operate at high data rates.

On the electrical side, the bandwidth of the driver to the first order is proportional to the RC time constant of the driver, where R is the VCSEL termination equivalent resistance and C is the total load capacitance seen by the driver and the VCSEL combined. The driver's bandwidth is mainly limited by the driver's load capacitance and large variations in the VCSEL resistance and capacitance. This results in large variations in the bandwidth and, thus, data transition behaviors having either excessive peaking or significant Inter-Symbol-Interference (ISI).

On the optical side, however, due to the optical power and extinction ratio (P1/P0) compliance requirements among other specifications, a great deal of programmability in VCSEL output power must be introduced to its biasing structure to handle such process and temperature variations. This could force the driver to accumulate even larger load capacitance and, thus, limiting the bandwidth of operation.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
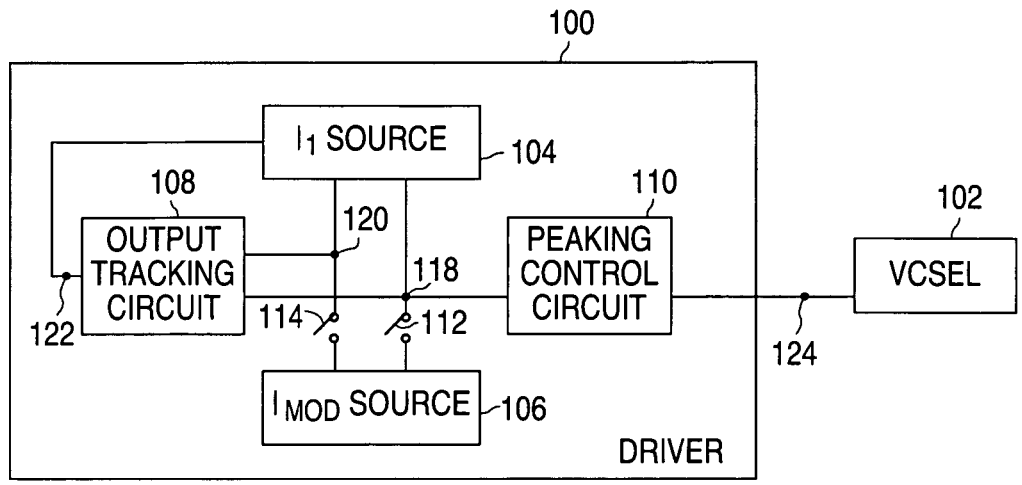
FIG. 1 is a block diagram illustrating a driver for a vertical-cavity surface-emitting laser in accordance with one embodiment of the present invention.
Figure 2:
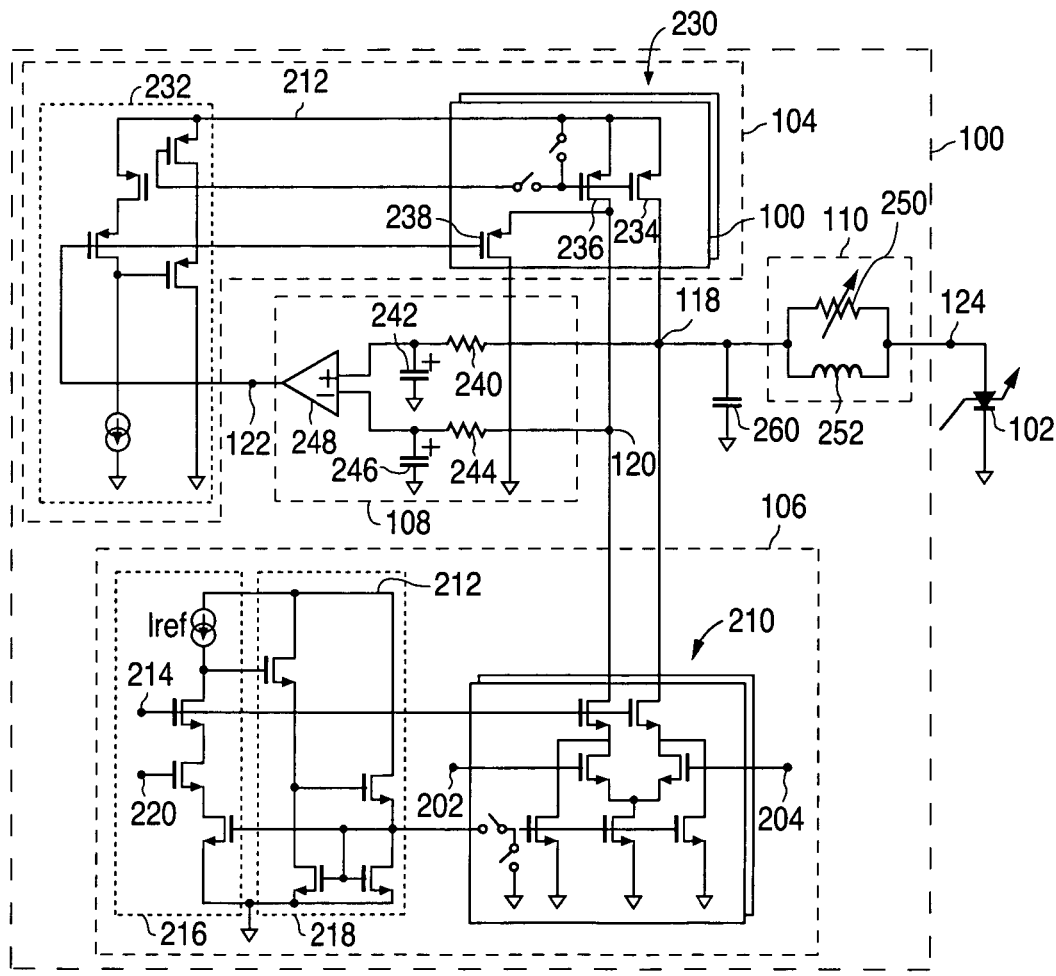
FIG. 2 is a circuit diagram illustrating the driver of FIG. 1 in accordance with one embodiment of the present invention.
Figure 3:
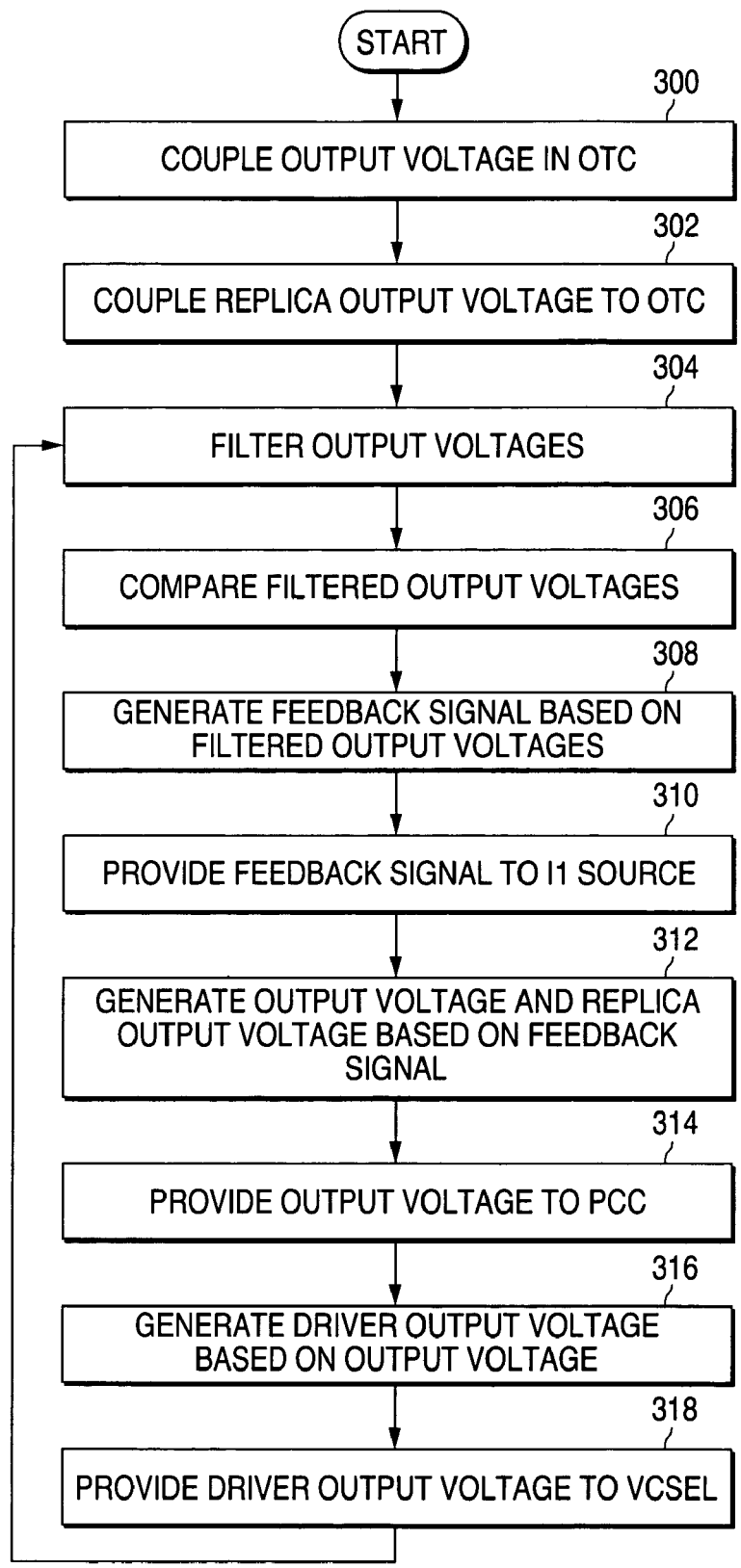
FIG. 3 is a flow diagram illustrating a method for operating the driver of FIG. 1 or 2 in accordance with one embodiment of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged driver for a vertical-cavity surface-emitting laser (VCSEL).

FIG. 1 is a block diagram illustrating a driver 100 for a vertical-cavity surface-emitting laser (VCSEL) 102 in accordance with one embodiment of the present invention. The driver 100, which is a Current Mode Logic driver, comprises two current sources 104 and 106 and either one or both of an output tracking circuit 108 and a peaking control circuit 110.

The current source 104 is operable to generate a programmable bias current, $I_1$, that may be delivered to the VCSEL 102. The $I_1$ current source 104 may be coupled to the current source 106 through switches 112 and 114. The $I_1$ source 104 is also operable to generate an output voltage 118 and a replica output voltage 120.

The current source 106 is operable to sink a programmable modulation current, $I_{mod}$, when the switches 112 and 114 are closed, thereby reducing the amount of current delivered to the VCSEL 102. The currents provided by the current sources 104 and 106 may be controlled (i) in an open-loop configuration, where the behavior of the VCSEL 102 is predictable, (ii) via a servo loop comprising a monitor diode that is operable to monitor the output power of the VCSEL 102, or (iii) in any other suitable manner.

The output tracking circuit 108 is coupled to the $I_1$ source 104 and is operable to track the output voltage 118 by comparing the output voltage 118 to the replica output voltage 120 and generating a feedback signal 122 for the $I_1$ source 104 based on any difference between the voltages 118 and 120. The $I_1$ source 104 is operable to generate the output voltages 118 and 120 based on the feedback signal 122. Thus, using the feedback signal 122, the $I_1$ source 104 is operable to match the output voltages 118 and 120.

The peaking control circuit 110 is also coupled to the $I_1$ source 104 and is coupled to the VCSEL 102. The peaking control circuit 110 is operable to generate a driver output voltage 124 for the VCSEL 102 based on the output voltage 118 by controlling peaking. Thus, the VCSEL 102 receives either the output voltage 118 without reduced peaking or the driver output voltage 124 with reduced peaking, depending on whether or not the peaking control circuit 110 is included in the driver 100.

In operation, according to one embodiment, the VCSEL 102 behaves like a diode and produces a forward voltage VBG when the VCSEL 102 is turned on. For one embodiment, the forward voltage range may be anywhere from 1.5-1.6V across process and temperature. The current available for the VCSEL 102 is referred to as Iload. In addition, the VCSEL 102 has an associated threshold current, Ith, that is needed in order to turn on the VCSEL 102. Thus, the actual current that is used to drive the VCSEL 102 may be written as:

$$I_{VCSEL} = I_{load} - I_{th}.$$

Therefore, when $I_{load}$ is greater than $I_{th}$, the VCSEL 102 is turned on, and when $I_{load}$ is less than or equal to $I_{th}$, the VCSEL 102 is turned off.

When the switches 112 and 114 are closed, the current available for the VCSEL 102, $I_{load}$, is given by:

$$I_{load} = I_1 - I_{mod}.$$

In this case, the VCSEL 102 is turned off. Similarly, when the switches 112 and 114 are open, the current available for the VCSEL 102, $I_{load}$, is given by:

$$I_{load} = I_1.$$

In this case, the VCSEL 102 is turned on.

In either situation, the output voltage 118 and the replica output voltage 120 are provided to the output tracking circuit 108 for embodiments in which the driver 100 includes the output tracking circuit 108. The output tracking circuit 108 compares the voltages 118 and 120 and generates the feedback voltage 122 based on any difference between the voltages 118 and 120. The feedback voltage 122 is provided to the $I_1$ source 104 to adjust the output voltage 118 and the replica output voltage 120 such that any difference between the voltages 118 and 120 is reduced.

The output voltage 118 is also provided to the VCSEL 102. If the driver 100 includes the optional peaking control circuit 110, the output voltage 118 is provided to the VCSEL 102 by way of the peaking control circuit 110. The peaking control circuit 110 controls peaking that exists in the output voltage 118 in order to generate the driver output voltage 124 for the VCSEL 102. Thus, the peaking control circuit 110 controls transition data peaking in the driver output voltage 124 and adjusts for inter-symbol interference. In this way, the peaking control circuit generates the driver output voltage 124 with less peaking than that which exists in the output voltage 118.

The VCSEL 102 is driven by the driver 100 using either the output voltage 118 or the driver output voltage 124 based on whether or not the peaking control circuit 110 is included in the driver 100. When the switches 112 and 114 are open, the driver 100 turns on the VCSEL 102. Similarly, when the switches 112 and 114 are closed, the driver 100 turns off the VCSEL 102.

The power to the load is delivered via the driver 100 switching at the data rate and, thus, the power logic levels may be written as:

$$P_1 = (I_1 - I_{th}) * SE$$

$$P_0 = (I_1 - I_{mod} - I_{th}) * SE,$$

where SE is the slope efficiency (mA/mW) of the VCSEL 102 that varies with process and temperature variations.

FIG. 2 is a circuit diagram illustrating the driver 100 in accordance with one embodiment of the present invention. For the illustrated embodiment, the driver 100 comprises both the output tracking circuit 108 and the peaking control circuit 110. However, it will be understood that the driver 100 may be implemented with one or the other of the output tracking circuit 108 and the peaking control circuit 110 instead of with both of these components.

The driver 100 comprises a differential implementation of a Current Mode Logic (CML) VCSEL driver in which the driver 100 is operable to deliver power to the VCSEL 102 as a single-ended output. For some embodiments, the data path is implemented as a differential configuration such that the inputs 202 and 204 are differential inputs received from a limiting amplifier (not shown in FIG. 2).

The $I_{mod}$ source 106 comprises a digital-to-analog converter 210, which comprises a plurality of cells (one of which is illustrated in FIG. 2). According to one embodiment, the digital-to-analog converter 210 comprises $2^N$ cells, where N=8 or any other suitable value. Each cell in the digital-to-analog converter 210 comprises two switches that may be closed in order to add the cell to the digital-to-analog converter 210 to increase the modulation current delivered by the $I_{mod}$ source 106 and that may be opened in order to remove the cell from the digital-to-analog converter 210 to decrease the modulation current delivered by the $I_{mod}$ source 106.

Each of the cells also comprises a CML-type of differential driver with high-voltage cascading transistors. For this embodiment, the VCSEL 102 may use a minimum of 3.3 Volts for a power supply 212. The high-voltage cascading transistors receive a bias voltage 214 that determines whether or not the transistors, which correspond to the switches 112 and 114, will be on or off.

The high-voltage transistors are each coupled to a leakage current source so that those transistors will remain turned on. This keeps the transistors from limiting the switching speed of the driver 100. In addition, the leakage current provided by the leakage current sources greatly improves the rise time seen at the sources of the high-voltage transistors in order to match more at the fall time. This occurs because, at the fall time, the switching current flows at a maximum level through the high-voltage transistors. The remaining transistors in the digital-to-analog converter 210 comprise low-voltage transistors in order to achieve high-speed switching during operation of the driver 100.

In addition to the digital-to-analog converter 210, the $I_{mod}$ source 106 comprises a current mirror 216 and a level shifting circuit 218. The current mirror 216 comprises three transistors that are employed as a replica biasing of the driver 100 in order to provide accurate current mirroring. A first transistor in the current mirror is operable to receive the bias voltage 214 and a second transistor is operable to receive an average voltage of 202 and 204, or a common mode voltage 220. A third transistor is operable to produce the mirroring gate bias voltage, which is proportional to the input reference current Iref. The gate bias voltage is fed to the digital-to-analog converter 210.

The level shifting circuit 218 comprises four transistors that form a regulated cascode configuration. This configuration allows the level shifting circuit 218 to provide proper level shifting such that all transistors remain in saturation. The current mirroring of the digital-to-analog converter 210 is provided by triple cascode transistors when the driver 100 is switched in order to deliver accurate modulation current to the VCSEL 102.

The $I_1$ source 104 comprises a digital-to-analog converter 230, which comprises a plurality of cells (one of which is illustrated in FIG. 2). According to one embodiment, the digital-to-analog converter 230 comprises $2^N$ cells, where N=8 or any other suitable value. Each cell in the digital-to-analog converter 230 comprises two switches that may be closed in order to add the cell to the digital-to-analog converter 230 to increase the bias current delivered by the $I_1$ source 104 and that may be opened in order to remove the cell from the digital-to-analog converter 230 to decrease the bias current delivered by the $I_1$ source 104.

Each of the cells also comprises two current sources, in the form of transistors 234 and 236 that are coupled to the power supply 212. The current sources 234 and 236 comprise high-voltage transistors in order to accommodate the supply requirement for the VCSEL 102. For one embodiment, the high-voltage transistors 234 and 236 are designed to be as small as possible while both remaining in saturation. In other words, the headroom for the transistors 234 and 236 may be calculated based on the VCSEL voltage 118 or 124 at the output of the driver 100, which corresponds to the forward voltage of the VCSEL 102 added to the IR drop across the equivalent resistance of the VCSEL 102.

Each of the cells in the digital-to-analog converter 230 also comprises a third transistor 238 that, in conjunction with the current source 236, is operable to replicate the VCSEL loading on the replica side. Instead of connecting the replica output voltage 120 to the power supply 212 directly, which generates differential noise current into the power supply 212 and produces tremendous supply noise for other blocks within the system, the replica output voltage 120 is coupled to the current source 236 and the third transistor 238, which function as a replica current source and replica load, respectively. This allows the output voltage 118 to be reasonably matched and tracked, eliminating differential noise injection current to the power supply 212. According to one embodiment, the replica load 238 may be designed to have the average impedance of a typical VCSEL 102.

The $I_1$ source 104 also comprises a biasing structure 232, which provides an accurate bias voltage to the digital-to-analog converter 230.

The output tracking circuit 108 is operable to track the output voltage 118 to the replica output voltage 120. The output tracking circuit 108 comprises a first resistor 240 and a first capacitor 242 that function as a low-pass filter for the output voltage 118 and comprises a second resistor 244 and a second capacitor 246 that function as a low-pass filter for the replica output voltage 120.

According to one embodiment, the resistors 240 and 244 may each comprise a resistance of approximately 50 KΩ to 100 KΩ and the capacitors 242 and 246 may each comprise a capacitance of approximately 1 pF to 2 pF. However, it will be understood that the resistors 240 and 244 and the capacitors 242 and 246 may comprise any suitable resistances and capacitances without departing from the scope of the present invention.

The output tracking circuit 108 also comprises a voltage amplifier 248 that is coupled to the filters. The voltage amplifier 248 is operable to compare the filtered output voltages 118 and 120 and to generate the feedback signal 122 based on any difference between the two voltages 118 and 120.

The feedback signal 122 is provided to the replica load 238 in the digital-to-analog converter 230, which acts as a source follower to provide the proper DC voltage to the replica output 120. The feedback signal 122 is also provided to the replica current source 236 in the digital-to-analog converter 230 to match that transistor's drain-to-source voltage to the other current source transistor 234 in the digital-to-analog converter 230. This effectively increases the output impedance of the current sources 234 and 236 in the digital-to-analog converter 230 at relatively low frequencies, which results in accurate current mirroring that tracks with VCSEL voltage variations across process and temperature.

The peaking control circuit 110 comprises a variable resistor digital-to-analog converter 250 and an inductor 252 coupled together in parallel. According to one embodiment, the resistor digital-to-analog converter 250 may comprise a resistance of between approximately 20Ω and 200Ω and the inductor 252 may comprise an inductance of approximately 3 to 4 nH. However, it will be understood that the resistor digital-to-analog converter 250 and the inductor 252 may comprise any suitable range of resistances and any suitable inductance without departing from the scope of the present invention.

The large capacitance of the digital-to-analog converters 210 and 230 may limit the ability of the driver 100 to meet high data rates, especially when the impedance of the VCSEL 102 is relatively high. The bandwidth, BW, is limited by the following equation:

$$BW=1/((CL+CT)*RT),$$

where CL is the total capacitance of the driver 100, CT is the capacitance of the VCSEL 102, and RT is the impedance of the VCSEL 102. Both CT and RT vary with process and temperature variations.

The inductor 252 provides isolation between CL and CT such that the bandwidth of the driver 100 may be enhanced. Thus, the induced characteristic impedance of the load may be written as:

$$Zo=\sqrt{(L/C)},$$

where L is the inductance of the inductor 252 and C is the average of CL and CT.

The resistor digital-to-analog converter 250 is operable to control the quality factor, Q, of the inductor 252, which effectively controls the peaking (isolation of the load capacitors) of the data transitions. This results in relatively constant currents across VCSEL process and temperature variations.

With respect to process variations, the resistor digital-to-analog converter 250 is adjusted during a testing phase of the chip for a given type of VCSEL 102, for example, during the IEEE template tests. With respect to temperature variations, a trim and compensation block may be used to monitor the change in power for a given change in the bias current provided by the $I_1$ source 104 in order to compute the change in termination resistance. By using a look-up table, the appropriate adjustments to the resistor digital-to-analog converter 250 may be applied.

The driver 100 also comprises a capacitor 260 that is operable to provide a filter between the output voltage 118 and the peaking control circuit 110 of the driver 100. According to one embodiment, the capacitor 260 may comprise a capacitance of approximately 1-2 pF. However, it will be understood that the capacitor 260 may comprise any suitable capacitance without departing from the scope of the present invention.

FIG. 3 is a flow diagram illustrating a method for operating the driver 100 in accordance with one embodiment of the present invention. The method begins at step 300 where the output voltage 118 is coupled to an output tracking circuit (OTC) 108. At step 302, the replica output voltage 120 is coupled to the output tracking circuit 108.

At step 304, the output tracking circuit 108 filters the output voltages 118 and 120. For one embodiment, the output voltages 118 and 120 are filtered with low-pass filters. At step 306, the output tracking circuit 108 compares the filtered output voltages. At step 308, the output tracking circuit 108 generates a feedback signal 122 based on any difference between the filtered output voltages.

At step 310, the output tracking circuit 108 provides the feedback signal 122 to an $I_1$ source 104. For example, for the embodiment illustrated in FIG. 2, the output tracking circuit 108 provides the feedback signal 122 to a replica current source 236 and to a replica load 238 in a digital-to-analog converter 230 in the $I_1$ source 104. At step 312, the $I_1$ source 104 generates the output voltage 118 and replica output voltage 120 based on the feedback signal 122. In generating the output voltages 118 and 120 based on the feedback signal, the $I_1$ source 104 matches the output voltage 118 and replica output voltage 120.

At step 314, the output signal 118 is provided to a peaking control circuit (PCC) 110. At step 316, the peaking control circuit 110 generates a driver output voltage 124 for the driver 100 based on the output voltage 118. The peaking control circuit 110 controls peaking in the data transitions such that the driver output voltage 124 comprises less peaking than the output voltage 118.

At step 318, the driver output voltage 124 is provided to a VCSEL 102, at which point the method returns to step 304 where the output tracking circuit 108 continues to low-pass filter the output voltages 118 and 120.

It will be understood that either steps 300-312 or steps 314-316 may be optional, depending on whether one of the output tracking circuit 108 and the peaking control circuit 110 is not included in the driver 100. It will also be understood that the voltage provided to the VCSEL 102 in step 318 is the output voltage 118 if the peaking control circuit 110 is omitted from the driver 100.

Although the present invention has been described with several embodiments, various changes and modifications may be suggested to one skilled in the art. It is intended that the present invention encompass such changes and modifications as fall within the scope of the appended claims.

What is claimed is:

1. A driver for a vertical-cavity surface emitting laser (VCSEL), comprising:
    a bias current source having an input and operable to generate at a first output a bias current and an output voltage for the VCSEL and to generate at a second output a replica output voltage;
    a modulation current source coupled to the bias current source by at least one switch and operable to generate a modulation current for the VCSEL when the switch is closed; and
    an output tracking circuit having first and second inputs coupled, respectively, to the first and second outputs of the bias current source, the output tracking circuit operable to compare the output voltage and the replica output voltage and generate at an output a feedback signal based on a result of the comparison, the output of the output tracking circuit coupled to the input of the bias current source, the bias current source further operable to generate the output voltage and the replica output voltage by matching the output voltage and the replica output voltage based on the feedback signal;
    wherein the bias current source comprises a digital-to-analog converter having a plurality of cells, each cell comprising (i) a first transistor operable to generate the bias current and the output voltage for the VCSEL and (ii) second and third transistors operable to generate the replica output voltage.

2. The driver of claim 1, the output tracking circuit operable to generate the feedback signal based on the output voltage and the replica output voltage by comparing the output voltage and the replica output voltage and generating the feedback signal based on any difference between the output voltage and the replica output voltage.

3. The driver of claim 1, the output tracking circuit operable to generate the feedback signal based on the output voltage and the replica output voltage by filtering the output voltage and the replica output voltage, comparing the filtered output voltage and the filtered replica output voltage, and amplifying any difference between the filtered output voltage and the filtered replica output voltage to generate the feedback signal.

4. The driver of claim 1, the output tracking circuit comprising a voltage amplifier, the voltage amplifier operable to compare the output voltage and the replica output voltage and to amplify any difference between the output voltage and the replica output voltage to generate the feedback signal.

5. The driver of claim 1, the output tracking circuit comprising a first filter operable to filter the output voltage, a second filter operable to filter the replica output voltage, and a voltage amplifier operable to compare the filtered output voltage and the filtered replica output voltage and to amplify any difference between the filtered output voltage and the filtered replica output voltage to generate the feedback signal.

6. The driver of claim 1, further comprising a peaking control circuit coupled to the bias current source and to the VCSEL, the peaking control circuit operable to receive the output voltage from the bias current source and to generate a driver output voltage for the VCSEL based on the output voltage, the driver output voltage comprising less peaking than the output voltage.

7. The driver of claim 1, wherein each of the cells further comprises one or more switches configured to selectively add that cell to the digital-to-analog converter and to remove that cell from the digital-to-analog converter in order to alter the bias current generated.

8. A driver for a vertical-cavity surface emitting laser (VCSEL), comprising:
    a bias current source having an input and operable to generate at a first output a bias current and an output voltage for the VCSEL and to generate at a second output a replica output voltage;
    a modulation current source coupled to the bias current source by at least one switch and operable to generate a modulation current for the VCSEL when the switch is closed; and
    an output tracking circuit having first and second inputs coupled, respectively, to the first and second outputs of the bias current source, the output tracking circuit operable to compare the output voltage and the replica output voltage and generate at an output a feedback signal based on a result of the comparison, the output of the output tracking circuit coupled to the input of the bias current source, the bias current source further operable to generate the output voltage and the replica output voltage based on the feedback signal;
    wherein the output tracking circuit comprises a first filter operable to filter the output voltage, a second filter operable to filter the replica output voltage, and a voltage amplifier operable to compare the filtered output voltage and the filtered replica output voltage and to amplify any difference between the filtered output voltage and the filtered replica output voltage to generate the feedback signal; and
    wherein the bias current source comprises, for each of a plurality of cells, a replica load and a replica current source, the replica load and the replica current source operable to receive the feedback signal from the voltage amplifier of the output tracking circuit and to generate the replica output voltage based on the feedback signal.

9. The driver of claim 8, wherein each of the cells further comprises one or more switches configured to selectively add that cell to a digital-to-analog converter and to remove that cell from the digital-to-analog converter in order to alter the bias current generated.

10. A driver for a vertical-cavity surface emitting laser (VCSEL), comprising:
- a bias current source comprising, for each of a plurality of cells, first, second and third transistors, the first transistor operable to generate a bias current and an output voltage for the VCSEL and the second and third transistors operable to generate a replica output voltage;
- a modulation current source coupled to the bias current source by at least one switch and operable to generate a modulation current for the VCSEL when the switch is closed; and
- an output tracking circuit coupled to the bias current source, the output tracking circuit comprising a first filter, a second filter and a voltage amplifier, the first filter operable to filter the output voltage, the second filter operable to filter the replica output voltage, and the voltage amplifier operable to generate a feedback signal for the bias current source based on any difference between the filtered output voltage and the filtered replica output voltage, the bias current source further operable to generate the output voltage and the replica output voltage based on the feedback signal.

11. The driver of claim 10, the bias current source operable to generate the output voltage and the replica output voltage based on the feedback signal by matching the output voltage and the replica output voltage based on the feedback signal.

12. The driver of claim 10, the voltage amplifier operable to generate the feedback signal by comparing the filtered output voltage and the filtered replica output voltage and amplifying any difference between the filtered output voltage and the filtered replica output voltage to generate the feedback signal.

13. The driver of claim 10, the second and third transistors of each of the cells of the bias current source comprising a replica current source and a replica load, the replica current source and the replica load operable to receive the feedback signal from the voltage amplifier of the output tracking circuit and to generate the replica output voltage based on the feedback signal.

14. The driver of claim 10, further comprising a peaking control circuit coupled to the bias current source and to the VCSEL, the peaking control circuit comprising a resistor digital-to-analog converter and an inductor coupled in parallel, the peaking control circuit operable to receive the output voltage from the bias current source and to generate a driver output voltage for the VCSEL based on the output voltage, the driver output voltage comprising less peaking than the output voltage.

15. The driver of claim 14, the resistor digital-to-analog converter comprising a resistance determined based on the VCSEL.

16. The driver of claim 10, the first filter comprising a first resistor and a first capacitor and the second filter comprising a second resistor and a second capacitor.

17. A method for driving a vertical-cavity surface emitting laser (VCSEL), comprising:
- receiving an output voltage from a first output of a bias current source, wherein the output voltage is generated for the VCSEL at the first output of the bias current source;
- receiving a replica output voltage from a second output of the bias current source;
- comparing the output voltage and the replica voltage;
- generating a feedback signal for an input of the bias current source based on the comparison of the output voltage and the replica output voltage; and
- continuing to generate the output voltage and the replica output voltage by matching the output voltage and the replica output voltage based on the feedback signal, the output voltage and the replica output voltage generated using a digital-to-analog converter having a plurality of cells, each cell comprising (i) a first transistor generating the output voltage and (ii) second and third transistors generating the replica output voltage.

18. The method of claim 17, generating the feedback signal based on the output voltage and the replica output voltage comprising filtering the output voltage and the replica output voltage, comparing the filtered output voltage and the filtered replica output voltage, and amplifying any difference between the filtered output voltage and the filtered replica output voltage to generate the feedback signal.

19. The method of claim 17, further comprising generating a driver output voltage for the VCSEL based on the output voltage by controlling peaking in the output voltage.

20. The method of claim 17, further comprising:
- closing one or more switches in at least one of the cells to add that at least one cell to the digital-to-analog converter to increase the bias current generated; and
- opening the one or more switches in the at least one cell to remove that at least one cell from the digital-to-analog converter to decrease the bias current generated.

* * * * *